United States Patent [19]

Bismarck

[11] 4,109,209
[45] Aug. 22, 1978

[54] PULSE STAGGERING CIRCUIT

[75] Inventor: Otto Herbert Bismarck, Fords, N.J.

[73] Assignee: RCA Corporation, New York, N.Y.

[21] Appl. No.: 775,152

[22] Filed: Mar. 7, 1977

[51] Int. Cl.² .............................................. H03K 3/64
[52] U.S. Cl. ....................................... 328/60; 328/62; 328/55; 328/66
[58] Field of Search ................... 328/108, 133, 60, 62, 328/55, 66

[56] References Cited

U.S. PATENT DOCUMENTS

| 3,382,376 | 5/1968 | Sowden | 328/133 X |
| 3,610,954 | 10/1971 | Treadway | 328/133 X |
| 3,626,307 | 12/1971 | Kuyama | 328/133 |
| 3,644,721 | 2/1972 | Preiser | 328/133 X |
| 3,755,746 | 8/1973 | Hogue et al. | 328/133 |
| 3,987,365 | 10/1976 | Okada et al. | 328/133 |

Primary Examiner—John S. Heyman
Attorney, Agent, or Firm—H. Christoffersen; Allen LeRoy Limberg

[57] ABSTRACT

A circuit for providing staggered responses to first and second pulse trains, includes first and second flip-flops set in response to the pulses of the first and second pulse trains, respectively. A third flip-flop is set in response to the first flip-flop being set concurrent with the second flip-flop being reset, and is reset in response to the second flip-flop being set concurrent with the first flip-flop being reset. Each pulse of a first output pulse train is defined by a first gating network responding to the concurrence of properly delayed responses of the set conditions of the first and third flip-flops, for producing a first output signal in response to a pulse of the first input pulse train, which output signal then resets the first flip-flop arranging for the conclusion of the output pulse. Each pulse of a second output pulse train is defined by a second gating network responding to the concurrence of the set condition of the second flip-flop and the reset condition of the third flip-flop, for producing a second output signal in response to a pulse of the second input pulse train, which output signal resets the second flip-flop arranging for the conclusion of the output pulse.

8 Claims, 4 Drawing Figures

PULSE STAGGERING CIRCUIT

The present invention relates to pulse signal conditioning circuits and, more specifically, to a pulse-staggering circuit for responding in seriatim to each pulse in first and second input pulse trains with a pulse in a corresponding one of first and second output pulse trains, which pulse does not concur with a pulse in the other output pulse train despite the concurrence of pulses in the input pulse trains.

In many situations it is desirable to modify the timing of pulses in first and second pulse trans which may have concurring pulses to produce a new pair of pulse trains with pulses that do not concur. E.g., certain up/down counter circuits are responsive to each pulse of a pulse train applied to a firt signal line for counting up, and to each pulse of a second pulse train applied to a second signal line for counting down, and are apt to miscount if pulses occur concurrently in the first and second pulse trains. E.g., in a pulse adder network, if certain ones of the pulses to be added of first and second pulse trains applied to the adder circuit overlap in time, an error will be produced in the output or sum signal of the adder.

The present invention is embodied in a pulsestaggering circuit including first and second bistable circuit means placed into a set condition responsive to the pulses of first and second input pulse trains, respectively. A third bistable circuit is set in response to the concurrence of the set and reset conditions of the first and second bistable circuits, respectively. The third bistable circuit is reset in response to the concurrence of the reset and set conditions of the first and second bistable circuits, respectively. Each pulse of a first output pulse train corresponding to respective pulses of the first input train is produced by a first gating network responding to the concurrence of the set conditions of the first and third bistable circuits. The first gating network so responds for producing an output signal representing the initiation of a pulse, which output signal then resets the first bistable circuit, for concluding the pulse. Similarly, each pulse of a second output pulse train corresponding to respective pulses of the second input pulse train is produced by a second gating network responding to the concurrence of the set and reset conditions of the first and third bistable circuits, respectively. The second gating network so responds for producing an output signal representing the initiation of a pulse, which output signal then resets the second bistable circuit, for concluding the pulse.

Figure 1:
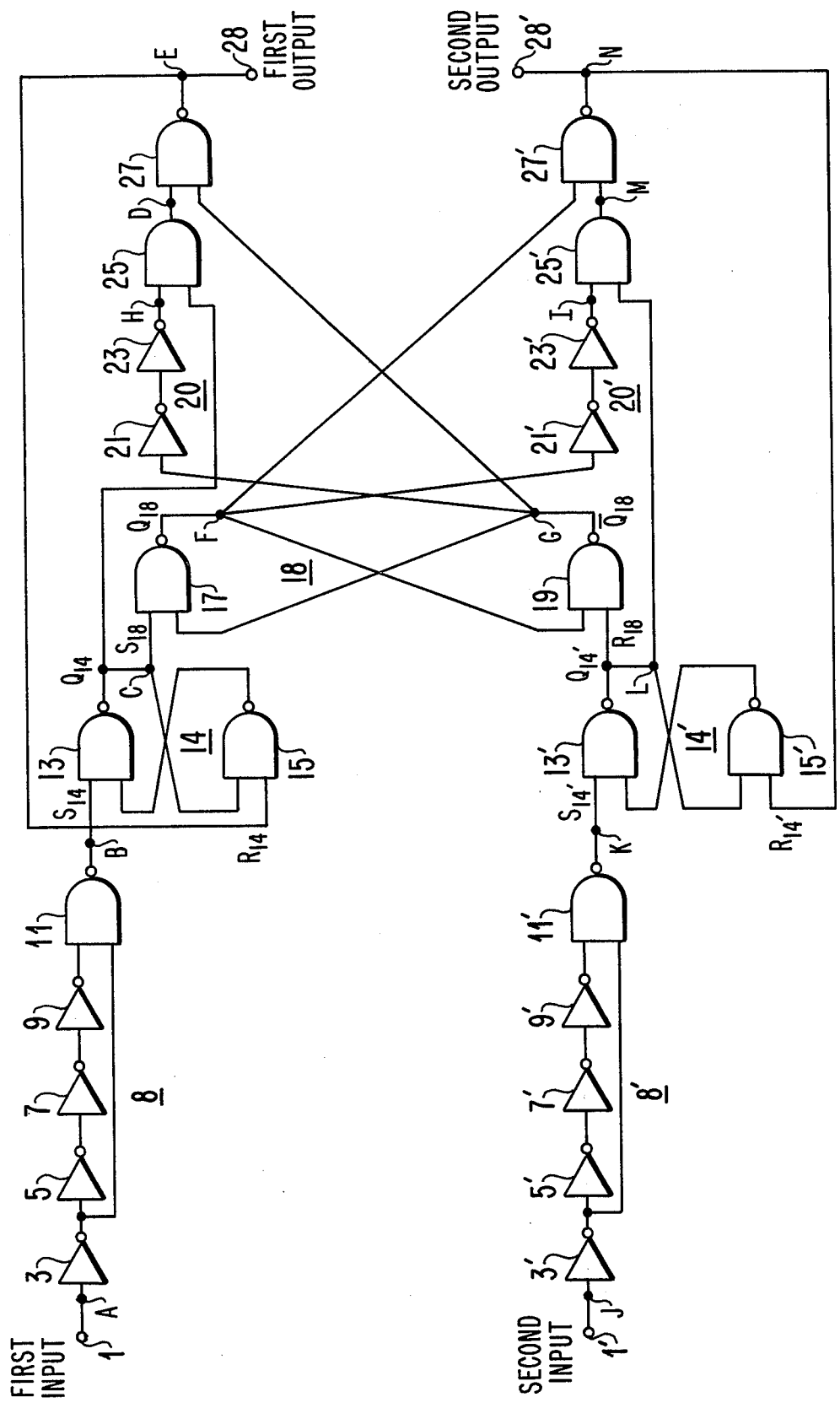
FIG. 1 is a schematic diagram of a pulsestaggering circuit embodying the invention.

In FIG. 1, the pulse staggering circuit configuration exhibits symmetry between its upper and lower halves. For the purpose of explanation, each of the logic inverters 3, 5, 7, 9, 21, 23, 3', 5', 7', 9', 21' and 23' is assumed to have a propagation time of about 10 ns (nanoseconds). Each of the NAND gates 11, 13, 15, 17, 19, 27, 11', 13', 15', 17', 19', 27' and the AND gates 25, 25' is assumed to have a propagation time of about 15 ns.

The operation of the circuit in FIG. 1 will be first described for the condition in which there is complete non-coincidences of the pulses in the first input and second input pulse trains applied to input terminals 1 and 1', respectively. NAND gates 13 and 15, are cross-coupled to form flip-flop 14; NAND gates 13' and 15' are cross-coupled to form flip-flop 14'; and NAND gates 17 and 19 are cross-coupled to form flip-flops 18. It is assumed initially that each one of these flip-flops 14, 14', and 18 are each in their reset conditions, so the levels of the signals at points C and L are each low (e.g. 0 volt), and at points F and G are each high (e.g. a positive level of voltage). The voltage level of the pulse trains is high, indicating the respective absence of an input pulse. Under these conditions the output signals at points E and N, applied to output terminals 28 and 28', respectively, each have a high level of voltage, indicating the respective absence of an output pulse.

Assume the voltage level of the first input pulse train now goes low, indicating the initiation of a pulse. The circuit combination including inverters 3, 5, 7, 9, and NAND gate 11, form a pulse differentiator 8. Pulse differentiator 8 responds to the leading edge of and presence of the first input pulse, for providing a substantially narrower negative going tripper pulse at point B. Flip-flop 14 responds to the leading edge of this trigger pulse applied to set terminal $S_{14}$. In response to the leading edge of this trigger pulse applied to its set terminal $S_{14}$, flip-flop 14 is placed into its set condition, and provides a high-level control signal at point C. This control is applied to both set terminal $S_{18}$ of flip-flop 18, and as an input signal to AND gate 25. In response to the simultaneous occurrence of the control signal and the high-level signal at G, NAND gate 17 changes its output signal at F from high to low level, in effect placing flip-flop 18 in its set condition.

The low-level signal now at point F is applied as a blocking signal to NAND gate 27', preventing its response to positive-going or high-level signals at point M, until an output pulse is produced at first output terminal 28 responsive to the input pulse applied to terminal 1. The high-level signal at point G is applied to NAND gate 27 as an input signal, for priming this gate.

Inverters 21 and 23 are cascaded to function as a delay line. The high-level signal at point G is propagated through delay line 20 to point H, and applied as one input signal to AND gate 25. AND gate 25 responds to the simultaneous occurrence of high-level signals at points C and H, for producing a high-level signal at point D. In response to the simultaneous occurrence of the high-level signals now at points D and G, NAND gate 27 responds by changing the level of its output signal at E, from a high-level to a low-level. This low-level output signal is applied both to first output terminal 28 as the initiation of an output pulse, and to reset terminal $R_{14}$ of flip-flop 14.

Flip-flop 14 resets in response to the concurrence of the low- and high-level signals at points E and B, respectively. In its reset condition, flip-flop 14 produces a low signal at point C. AND gate 25 responds to change signal level at C from high to low level, changing its output signal at D from high to low level. In turn, NAND gate 27 responds to this change in signal level at D by changing its output signal at E from low to high level, for concluding the output pulse at terminal 28. Assuming a propagation time of 15 nanoseconds for the NAND gates 13, 15, 27 and for AND gate 25, the width of the output pulse produced at the first output terminal 28 is about 60 nanoseconds.

In the manner described, an output pulse of a first output pulse train has been produced at terminal 28 in response to the application of an input pulse of a first input pulse train to input terminal 1. The operation of the circuit, for example, when a pulse of a second input pulse train is applied to terminal 1', absent any overlap with input pulses applied to terminal 1, can be described by syntactic similarity to the above-described operation, by substituting primed for unprimed reference numerals, and vice versa, and letters A, B, C, F, H, D, E, for J, K, L, G, I, M, N, respectively.

The operation of the circuit for the condition in which there is overlapping of pulses in the pulse trains applied to terminals 1 and 1' may be described in simplistic terms as follows. If first and second input pulses are applied to first and second input terminals 1 and 1', respectively, and it is assumed that these input pulses overlap in time, pulse differentiator circuit 8 responds to the first input pulse for applying a set signal to flip-flop 14, and pulse differentiator circuit 8' responds to the second input pulse for applying a set signal to flip-flop 14' (see FIG. 2). If flip-flop 14 is placed in its set condition prior to flip-flop 14' being placed in its set condition, flip-flop 18 will respond to the concurrence of the set condition of flip-flop 14 and the reset condition of flip-flop 14', by going into its set condition. In its set condition, flip-flop 18 applies a blocking signal to NAND gate 27', inhibiting this NAND gate, and also applies a priming signal to NAND gate 27, enabling this latter NAND gate. In its set condition, flip-flop 14 provides a first control signal to AND gate 25. Delay line 20 in response to the priming signal at point G, applies a high-level signal as a second enabling input to AND gate 25, and AND gate 25 responds by producing a high-level signal at point D. In turn, NAND gate 27 responds to the high-level signals now at points D and G, by producing a low-level signal at point E for application to output terminal 28 and to the reset terminal $R_{14}$ of flip-flop 14. Flip-flop 14 is reset, extinguishing the first control signal at point C, causing the signal at point C to go low. In turn, AND gate 25 responds thereto by changing its output signal at point D from high to low level. NAND gate 27 responds thereto by changing its output signal at point E from low to high level, completing the production of an output pulse at output terminal 28.

With flip-flop 14 now reset and flip-flop 14' set, flip-flop 18 responds thereto by going into its reset condition, for producing a low-level signal at point G, which is applied to block or inhibit NAND gate 27. At the same time, the output signal at point F is now high, enabling NAND gate 27' for responding to changes in the voltage level of the signal at point M. When the signal at point F initially goes high, NAND gate 27' is prevented from responding, because AND gate 25' maintains a low-level signal at M. Delay line 20' responds to the level change at F a predetermined period of time thereafter, for applying a high level of voltage at point I. AND gate 25', in response to the high signals at I and L, changes its output signal at point M from low to high level. In response thereto NAND gate 27' changes its output signal at point N from high to low level. The low-level signal now at point N is applied to output terminal 28' as an output response to the input pulse applied to input terminal 1', and is also applied to reset terminal $R_{14}'$ of flip-flop 14'. In response thereto, flip-flop 14' goes into its reset condition, and changes its output signal at point L from a high to low level. In turn, AND gate 25' responds thereto by changing its output signal at point M from high to low level. NAND gate 27' responds to the change in signal level at point M by changing its output signal at point N from low to high level. This completes the production of a negative-going pulse at output terminal 28' in response to the input pulse applied to terminal 1'. The low level signal now at point L is applied to NAND gate 19, which responds thereto by changing the output signal at point G from low to high level, thereby enabling NAND gate 27. NAND gate 27 can now respond to the signal at D changing from a low level to a high level, for producing an output signal at terminal 28.

Delay lines 20 and 20' are used in association with AND gates 25 and 25', respectively, to insure that the output pulses produced at output terminals 28 and 28', are always staggered sufficiently to be fully separated in time. In applications where it is not necessary that there be a time separation between the output pulses; delay lines 20, 20', and AND gates 25, 25', are omitted together with connections to them; C is connected directly to D; and L is connected directly to M.

Figure 2:
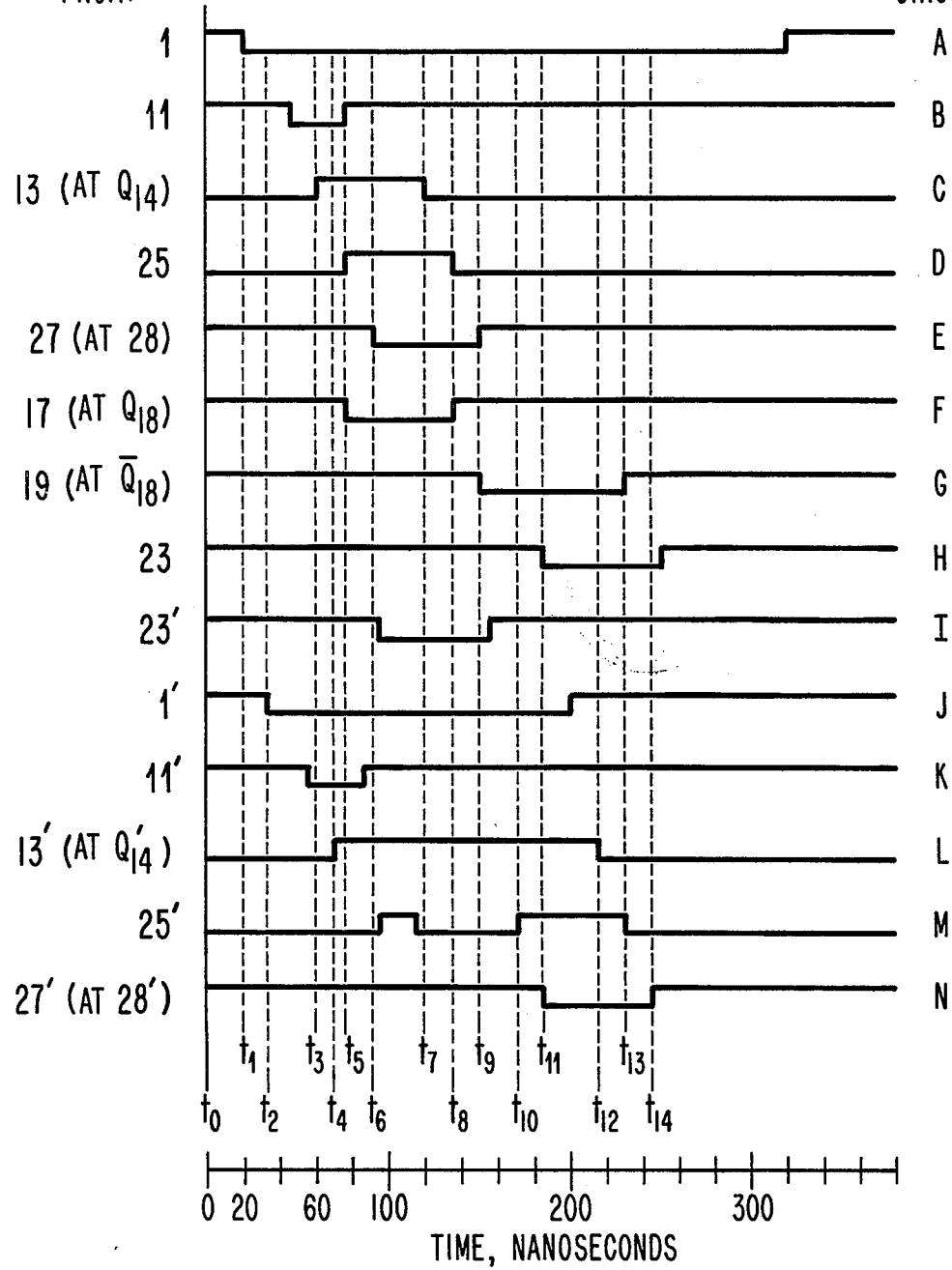
FIG. 2 is a timing chart showing the signal flow in the operation of the FIG. 1 pulse staggering circuit.

The FIG. 2 timing diagram shows how the FIG. 1 pulse staggering circuit responds to overlapping pulses of first input and second input pulse trains A and J, applied respectively to the first input terminal 1 and to the second input terminal 1' as shown. Initially, at time $t_o$, it is assumed that the 1 and 1' terminals, are each at relatively high-voltage level, indicative of the absence of pules in both the first input and second input pulse trains. First and second output terminals 28 and 28' are also each at a high level of voltage, indicative of the absence of pulses in both the first output and second output pulse trains. The voltage levels at time $t_o$ of the other of the various signal points A through N in FIG. 1 are assumed to have the levels shown in FIG. 2. The flip-flops are designated as being in their reset state at time $t_o$, to establish the convention by which their status shall be described in the following detailed explanation.

At time $t_1$, the voltage level of the first input pule train goes low (see A) for about 300 ns, indicative of a pulse. About 25 ns later, the pulse differentiator 8 produces a relatively short duration negative-going pulse at point B, that sets the first flip-flop 14. About 15 ns after the initiation of the triggering or set pulse at point B, at time $t_3$, NAND gate 13 responds by changing its output signal at point C from low to high level. At this time, flip-flop 14' is still reset, and provides a low level of voltage at L. This low level signal is applied to the reset terminal $R_{18}$ of NAND gate 19, which responds to provide a high level signal at G. NAND gate 17 is responsive to the high level signals at C and G to provide a negative-going pulse at F at a time $t_5$, about 15 ns after the initiation of the positive going control signal at C. The negative-going signal at point F is applied to NAND gate 27' as a blocking signal, to prevent NAND gate 27' from responding to changes in the voltage level at point M, thereby maintaining the signal at point N at a high level of voltage. Until time $t_5$, the level of voltage at point G has remained high, whereby in response thereto, delay line 20 is continuously providing a high-level signal at point H, for priming AND gate 25. Accordingly, about 15 ns after the initiation of the positive-going first control signal at point C at time $t_3$, AND gate 25 responds by producing a positive-going signal at point D at time $t_5$. In turn, NAND gate 27 responds about 15 ns after the initiation of the second control or positive going signal at point D, concurrent with the signal at point G having a positive level of voltage (absence of a blocking signal), for producing a negative-going signal at point E at time $t_6$. This negative-going signal at E is applied as an output signal to output terminal 28, and is the initiation of a response to the first input pulse of the first input pulse train. The negative-going output signal at point E is also applied to the reset terminal $R_{14}$ of flip-flop 14. In response thereto, flip-flop 14 resets about 30 ns later at time $t_7$, changing the level of voltage at point C from high to low level, extinguishing the first control signal. About 15 ns later, in response to the extinguishment of this first control signal or the level of voltage at point C going again low, AND gate 25 changes its output signal or second control signal at point D from high to low level at time $t_8$. About 15 ns later, at time $t_9$ NAND gate 27 responds to this by changing its output signal at E from low to high level, thereby completing the production of an output pulse at terminal 1 in response to the application of an input pulse at terminal 1.

As indicated above, in producing the output pulse at output terminal 28, flip-flop 14 of the upper logic circuit was set at a time that flip-flop 14' was still in a reset condition, permitting flip-flop 18 to be set. In its set condition, flip-flop 18 provides a blocking signal or low-level signal at point F that is applied as an input signal to NAND gate 27' of the lower circuit path. In this manner, NAND gate 27' is blocked from producing a low level output signal at output terminal 28' in response to a positive going signal at M. A predetermined time after the production of an output pulse at the first output terminal 28, this blocking signal is extinguished.

In the example given, about 10 ns after the application of the first negative-going pulse to input terminal 1, a second negative-going pulse of the second pulse train is applied to input terminal 1' at time $t_2$. About 25 ns after the initiation of the second input pulse at terminal 1', pulse differentiator 8' responds by producing a negative-going pulse at point K, for application as a set signal to the set terminal $S_{14}'$ of flip-flop 14'. NAND gate 13' responds in about 15 ns by changing its output signal at point L from low to high level at time $t_4$, for application to reset terminal $R_{18}$ of flip-flop 18, for resetting that flip-flop. At this time, and for a period of time thereafter, flip-flop 18 cannot be reset because of the previous setting of flip-flop 14 for producing a high-level signal at point C. This high level or first control signal at point C causes flip-flop 18 to be retained in the set state, whereby the signal at point F is at a low level, thereby inhibiting NAND gate 19 from responding to a reset signal. Until flip-flop 14 is reset as previously described, flip-flop 14' will in effect remain in the set state, for storing the receipt of an input pulse at input terminal 1', until an output signal in response thereto is produced at the second output terminal 28'.

Just after flip-flop 18 is set by the first control signal, as previously described, for changing the signal at point F from high to low level, this low level signal is applied to delay line 20'. In about 20 ns delay line 20' responds by changing its output signal at point I from high to low level. During this 20 ns propagation or delay time, the voltages at points I and L are both at high level. AND gate 25' responds in about 20 ns by changing its output signal at point M from low to high level. This positive-going signal at point M is of short duration, for upon the signal output from delay line 20' going low at I, in response to the signal at point F having gone low, AND gate 25' responds thereto about 15 ns later, by changing its output signal at point M from high to low level. The resultant positive-going pulse produced at point M between times $t_4$ and $t_7$ (see waveform M), is not responded to by NAND gate 27', in that this NAND gate is blocked by the low level signal at point F, as previously described.

At time $t_7$, the first control signal at point C is extinguished, as previously described, causing a low-level signal to be applied to point C from flip-flop 14. NAND gate 17, in response to this low-level signal, produces a high-level signal at point F at time $t_8$, unblocking NAND gate 19. NAND gate 19 responds to the concurrent high-level signals at points L and F, by producing a low level signal at point G at time $t_9$, for resetting flip-flop 18. The low level signal now at point G blocks or inhibits NAND gate 27 from responding to any changes in the voltage level of the signal at point D. This blocking signal remains until after an output pulse has been produced at the second output terminal 28' in response to an input pulse applied to terminal 1'. (This would be the case if flip-flop 14' had been set prior to flip-flop 14 having been set, contrary to the example given.) Also, NAND gate 27' is enabled by the changing of the signal at point F from low (blocking) to high level, as previously described. About 15 ns after the signal at point F again goes high, delay line 20' responds by changing its output signal at point I from low to high level. AND gate 25' responds to the concurrent high level signals at points L and I, by changing its output signal at point M, from low to high level at time $t_{10}$. NAND gate 27' now responds to the concurrent high level signals at points L and M, by producing a low level output signal at point N at time $t_{11}$. The low level signal at point N is applied to output terminal 28' and to reset terminal $R_{14}'$ of flip-flip 14'. About 30 ns later, flip-flop 14' resets, changing its output signal, applied to point L, from high to low level at time $t_{12}$. AND gate 25' responds thereto by changing its output signal at point M from a high level to a low level at time $t_{13}$. In response to the change of this signal level at point M, NAND gate 27' responds 15 ns later by changing its output signal at point N from low to high level at time $t_{14}$. This completes the response to the pulse applied to input terminal 1'.

In the representative circuit described, the first output pulse produced at output terminal 28 is separated from the second output pulse produced at output terminal 28' by about 30 ns (period between times $t_9$ and $t_{11}$). Thus, in the manner described, the circuit has responded to a first pulse of a first pulse train, and a second pulse of a second pulse train (occurring within the pulse time of the first pulse), for producing staggered output pulses at output terminals 28 and 28', respectively. The operation of the circuit, for example, when the input pulse previously applied to terminal 1 is applied to terminal 1' instead, and the input pulse previously applied to terminal 1' is instead applied to terminal 1, can be described by syntactic similarity to the above-described operation, by substituting primed for unprimed reference numerals and letters A, B, C, F, H, D, E, for J, K, L, G, I, M, N, respectively.

Figure 3:
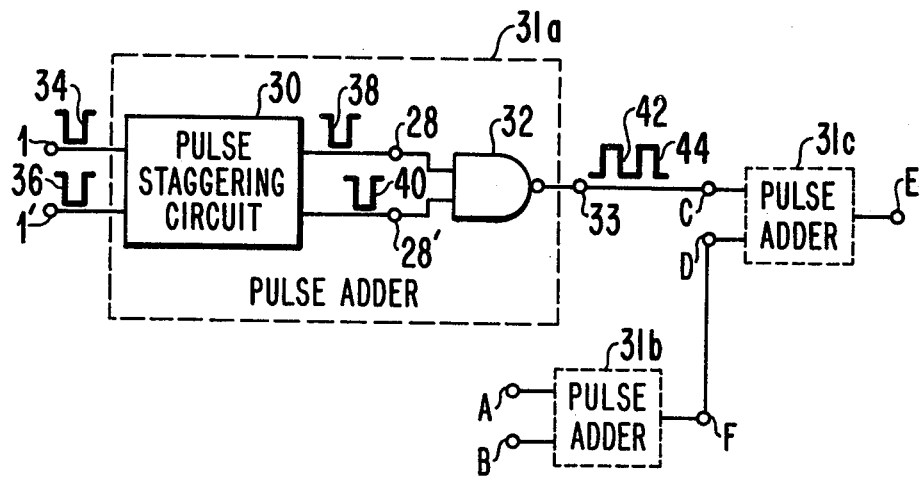
FIG. 3 is a block-schematic diagram showing the pulse staggering circuit connected in a pulse adder system.

In FIG. 3, a pulse staggering circuit 30 of the type shown in FIG. 1 is shown in combination with a NAND gate 32 for providing a pulse adder 31a. If a pair of input pules 34, 36, overlapping in time are applied to input terminals 1 and 1', respectively, the pulse staggering circuit 30 produces a pair of staggered negative-going output pulses 38, 40 at output terminals 28, 28', respectively. NAND gate 32 responds to these negative-going pulses 38, 40 with successive pulses 42, 44, respectively. This process leads to interleaved pulse responses at 33 to each of the pulses in the first and second-input pulse trains applied to 1 and 1'. Similarly, pulse adder systems 31b and 31c, each identical to 31a, can be connected as shown, for providing a pulse adder system capable of adding two pairs of input pulse trains having pulses overlapping in time. In this case, an individual input pulse train would be applied to input terminals 1, 1', A and B, respectively. An output pulse train is produced at output terminal E providing interleaved pulse responses to the pulses of the four input pulse trains. Of course, the number of input pulse trains that can be so added is limited by the frequency and pulse width response capability of the pulse adder systems.

Figure 4:
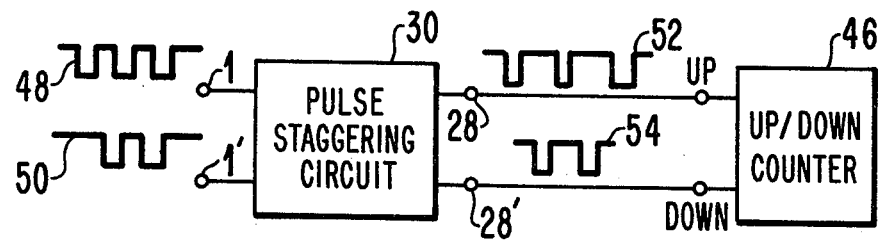
FIG. 4 is a block-schematic diagram showing the pulse staggering circuit connected in an up/down counter system, each of the FIG. 3 and FIG. 4 systems being in accordance with a respective further aspect of the invention.

In FIG. 4, the pulse staggering circuit 30 of the type shown in FIG. 1 is shown in combination with an up/down counter 46. The pulses of a first input pulse train 48, for directing counter 46 to count up may, as shown, overlap the pulses of a second pulse train 50 for directing counter 46 to count down. An overlap of the pulses in the first and second input pulse trains 48, 50, if applied directly to an up/down counter such as 46, tend to cause its count to be unpredictably controlled, since the counter 46 is called upon to count up and to count down at the same time, which the counter cannot do. Pulse staggering circuit 30 responds to the first and second input pulse trains 48 and 50 to produce pulse trains 52 and 54, in which the pulses are disposed in time in the same order as in pulse trains 48 and 50, respectively, but which are not coincident. Counter 46 is able to respond predictably to the pulses of trains 48 and 50, counting up in response to the pulses in one train and counting down in response to the pulses in the other train.

What is claimed is:

1. A pulse-staggering circuit for providing first and second output pulse trains responsive to first and second input pulse trains, with the pulses in said first and said second output pulse trains appearing in the same order in time as those in said first and second input pulse trains, respectively, but staggered in time, said pulse staggering circuit comprising:

first bistable circuit means placed into a first of its states in response to each pulse of said first input pulse train, for producing a first control signal, and placed into a second of its states responsive to a first reset signal;

second bistable circuit means placed into a first of its states in response to each pulse of said second input pulse train, for producing a second control signal, and placed into a second of its states responsive to a second reset signal;

third bistable circuit means having a set input receptive of a set signal corresponding to said first control signal, and having a reset input receptive of a third reset signal corresponding to said second control signal, said third bistable circuit means of a type responsive to either the occurrence of said set signal in the absence of said third reset signal, for producing a first blocking signal and extinguishing a second blocking signal, or to the occurrence of said third reset signal in the absence of said set signal for both producing said second blocking signal and extinguishing said first blocking signal;

first gating means receiving as input signals said first control and second blocking signals, responsive to the concurrence of said first control signal and the absence of said second blocking signal, for producing a first output signal, applied as the first reset signal to said first bistable circuit means, to extinguish said first control signal, and consequently to extinguish said first output signal; and second gating means receiving as input signals said second control and first blocking signals, responsive to the concurrence of said second control signal and the absence of said first blocking signal, for producing a second output signal, applied as the second reset signal of said second bistable circuit means to extinguish said second control signal, and consequently to extinguish said second output signal.

2. The pulse staggering circuit of claim 1, wherein said first bistable circuit means, includes:

differentiating network means responsive to each pulse of said first pulse train, for producing a triggering pulse; and a flip-flop set in response to said triggering pulse, for producing said first control signal, and reset in response to said first output signal, for extinguishing said first control signal.

3. The pulse staggering circuit of claim 1, wherein said second bistable circuit means, includes:

differentiating network means responsive to each pulse of said second pulse train, for producing a triggering pulse; and a flip-flop set in response to said triggering pulse, for producing said second control signal, and reset in response to said second output signal, for extinguishing said second control signal.

4. The pulse staggering circuit of claim 1, wherein said first gating means includes:

first delay means receiving said second blocking signal as an input signal, responsive to the absence of said second blocking signal, for producing a first priming signal a predetermined time subsequent to the extinguishment of said second blocking signal;

first digital logic means receiving as input signals said first priming signal and first control signals, responsive to the simultaneous occurrence of its input signals, for producing a third control signal; and second digital logic means receiving as input signals said third control signal and said second blocking signal, responsive to one of the concurrence of said third control signal and absence of said second blocking signal, for producing an output signal having a first level of voltage, to the extinguishment of said third control signal for changing the level of its output signal to a second level of voltage, and to said second blocking signal for maintaining the level of its output signal at the second level of voltage, thereby inhibiting said second digital logic means.

5. The pulse staggering circuit of claim 4, wherein said second gating means further includes:

second delay means receiving said first blocking signal as an input signal, responsive to the absence of said first blocking signal, for producing a first priming signal a predetermined time subsequent to the extinguishment of said second blocking signal;

third digital logic means receiving as input signals said first priming signal and second control signal, responsive to the simultaneous occurrence of its input signals, for producing a third control signal; and fourth digital logic means receiving as input signals said third control signal, and said first blocking signal, responsive to one of the concurrence of said third control signal and absence of said first blocking signal, for producing an output signal having a first level of voltage, to the extinguishment of said third control signal for changing the level of its output signal to a second level of voltage, and to said first blocking signal for maintaining the level of its output signal at the second level of voltage, thereby inhibiting said fourth digital logic means.

6. A circuit for providing staggered responses to first and second individual pulse trains conducted by separate signal lines, comprising:

first and second differentiating means responsive to each pulse of said first and second pulse trains, respectively, for providing first and second triggering signals, respectively;

first and second flip-flops responsive to said first and second triggering pulses, respectively, for providing first and second control signals, respectively;

a third flip-flop connected between said first and second flip-flops responsive to one of the occurrence of said first control signal in the absence of said second control signal, for both producing a first blocking signal and extinguishing a second blocking signal, and the occurrence of said second control signal in the absence of said first control signal, for both producing said second blocking signal and extinguishing said first blocking signal;

first gating means responsive to the concurrence of said first control signal and absence of said second blocking signal, for producing a third control signal a predetermined time after the extinguishment of said second blocking signal;

second gating means respnsive to the concurrence of said third control signal and absence of said second blocking signal, for producing a first output signal, said first flip-flop being responsive to said first output signal in the absence of a pulse of said first pulse train, for extinguishing said first control signal;

third gating means responsive to the concurrence of said second control signal and absence of said first blocking signal, for producing a fourth control signal, a predetermined time after the extinguishment of said first blocking signal; and fourth gating means responsive to the concurrence of said fourth control signal and absence of said first blocking signal, for producing a second output signal, said second flip-flop being responsive to said second output signal in the absence of a pulse of said second pulse train, for extinguishing said second control signal.

7. The circuit of claim 6, wherein said first gating means further includes:

first and second input terminals, said first input terminal being receptive of said first control signal; and delay means receiving said second blocking signal as an input signal, for applying an input signal to said second input terminal indicative of and at a predetermined time after the extinguishment of said second blocking signal.

8. The circuit of claim 7, wherein said third gating means further includes:

first and second input terminals, said first input terminal being receptive of said second control signal; and delay means receiving said first blocking signal as an input signal, for applying an input signal to said second input terminal indicative of and at a predetermined time after the extinguishment of said first blocking signal.

* * * * *